United States Patent [19]
Kueneman et al.

[11] 4,081,600
[45] Mar. 28, 1978

[54] HIGH DENSITY THICK FOIL CIRCUITRY LAMINATED PACKAGE

[75] Inventors: Joseph A. Kueneman, Torrance; Kenneth W. Nestor, Los Angeles; Adolph J. Miera, El Segundo, all of Calif.

[73] Assignee: Buss Systems, Inc., El Segundo, Calif.

[21] Appl. No.: 709,457

[22] Filed: Jul. 28, 1976

[51] Int. Cl.² .................... H05K 1/02; H05K 3/06
[52] U.S. Cl. .................... 174/68.5; 29/625; 156/224; 156/300; 156/629; 156/634; 156/659; 264/258; 264/272; 264/320; 428/172; 428/251; 428/415; 428/474
[58] Field of Search ............... 264/134, 135, 258, 272, 264/320; 428/172, 901, 251, 415, 474; 29/625, 627; 156/3, 8, 222, 224, 293, 300, 303.1, 629, 630, 633, 634, 659, 901, 902; 339/17 R, 17 A, 17 B, 17 C, 17 CF, 17 E, 17 T; 174/68.5

[56] References Cited
U.S. PATENT DOCUMENTS

| 2,757,443 | 8/1956 | Steigerwalt et al. | 156/219 X |
| 2,964,442 | 12/1960 | Hansen | 156/224 X |
| 2,988,839 | 6/1961 | Greenman et al. | 156/3 X |

Primary Examiner—David Klein
Assistant Examiner—Thomas Bokan
Attorney, Agent, or Firm—Emmette R. Holman

[57] ABSTRACT

Improvements are disclosed in the conventional process for the laminated packaging of etched circuitry consisting of:

(1) A unitized form tool which is produced by photo-masking a metal plate, with the same pattern master transparency that is used for producing the photo-etched circuitry, followed by chemical milling of the exposed areas to a depth equal to the thickness of the circuitry, (2) the manufacturer's low pressure dwell cycle in the press for prepreg containing epoxy resin or polyimide resin is for either resin changed to 210± 15 secs. at 10± 1 psi and 340° F. Thereafter the process returns to the manufacturer's specification for the specific resin for the remaining steps of the press and cure cycle, except that the cure is interrupted 60 minutes short of complete cure, (3) the cavity is preformed in the press in the precursor of the laminated board using the form tool of (1) and the conventional press cycle as modified per (2), and the interrupted post cure cycle per (2) is completed in the press under conditions specified for the specific resin by the manufacturer, to provide a completely bonded laminated circuit package.

An improved process and, as new articles of manufacture, a laminated board with preformed cavity and a void-free laminated circuit package are disclosed.

20 Claims, 5 Drawing Figures

HIGH DENSITY THICK FOIL CIRCUITRY LAMINATED PACKAGE

BACKGROUND OF THE INVENTION

This invention relates to an improvement in the prior art process for void-free packaging of high density thick foil (HDTF) circuitry, and to the utilization therein, as a new article of manufacture, of a laminated board having thermoformed therein a precisely shaped and dimensioned cavity. The lateral walls of the cavity reproduce faithfully a convex profile, approximating in cross-section a circular arc complementary to the characteristic concavely dished profile of the lateral wall of a chemically milled surface. In such a preformed cavity the circuitry is rigidly confined within its walls in an intimately mating relationship. In addition to being immobilized, it is protected from corrosion by virtue of the elimination of voids which can provide and maintain a corrosive environment, notably moisture, among other elements.

HDTF circuitry is a relatively recent development as compared with low current (LC) circuitry. In LC circuitry, where the continuous duty rating never exceeds 0.5 amperes, the conductor is thin, i.e., it has a thickness of from about 0.0007 inch to about 0.0028 inch.

LC circuitry is satisfactorily packaged by the process of the prior art, i.e., the press and curing cycle specified by the manufacturer of the prepreg (resin-imbedded woven glass fabric) for the specific resin involved, whereby the circuitry, adhesively supported on a supporting resin layer, is itself superimposed over a bonding sheet overlaid upon the precursor of the laminated board, i.e., a plurality of layers of prepreg. For a prepreg based on epoxy resin this stacked composite is placed between the platens of a press preheated to 340° F. and held therebetween for a low pressure dwell at 20 psi for 180 seconds followed by a high pressure dwell at 250 psi for 57 minutes to complete the necessary 60 mins. at 340° F. for completing the cure of the resin of the precursor. The symbol "psi" as used throughout this disclosure adopts a commonly used designation for pressure in lbs./in.$^2$ based on the net plan view area of the contacting surface.

For a laminated board based on polyimide resin the press and curing cycle specified by the manufacturer is: preheat the platens of the press to 250° F., insert the stacked composite therebetween, apply 200–500 psi pressure for 15 minutes, raise the temperature to 350° F. and hold under pressure for 2 hours, cool platens to 125° F., release the pressure, remove the stacked composite from the press, separate the uncured laminated circuit package from the other components of the stacked composite, reclamp and place into a circulating air oven at 425° F. for 4 hours to effect a complete cure.

The epoxy or polyimide resin composite, after having achieved a complete cure at high temperature, is cooled to ambient temperature under pressure, released from pressure, and the completed laminated circuit package is removed from the press or clamp, respectively.

At the high temperature in the press the bonding sheet softens and flows under pressure, being retained only in minimal amount as adhesive film for bonding the package components together. Last but most importantly, the circuitry, backed by the supporting sheet which is already in the completely cured stage and therefore unyielding, is pushed into the heat-softened resin of the precursor to form its own cavity therein.

The precursor of the laminated board, as used herein, consists of a stacked plurality of individual sheets of resin-imbedded woven glass fabric, commonly known as "prepreg." The resin of prepreg is a thermosetting resin in an incomplete state of cure, generally referred to as "B stage."

The above described process for LC circuitry is unsatisfactory for HDTF circuitry, where the conductor thickness of from about 0.004 inch to about 0.025 inch, typically about 0.010 inch, is much heavier in order to carry a much higher continuous duty rating of from about 5 A. to about 100 A., typically about 40 A. A correspondingly deeper cavity must be formed in the precursor. The ratio of the depth of the cavity to the overall pressed thickness of the laminated board containing said cavity, hereinafter designated as the compression ratio (CR), typically ranges from about 35% to about 77% for HDTF circuitry as compared with about 25% max. for LC circuitry.

In the packaging of HDTF circuitry in comparison with LC circuitry the displacement of resin is greater, while the downward distortion and compression and the horizontal stretching of the woven glass fabric is more severe. These factors combine to aggravate the problem of proper flow of the heat-softened prepreg resin in the press to obtain good distribution and intimate packing thereof around the circuitry as it sinks into the resin. The thermoplastic resin bonding the circuitry to the supporting sheet likewise softens at the temperature of the press, freeing the circuitry to swim and drift out of its intended position and from its precise registry with associated components of circuitry. Large air bubbles or voids occur adjacent the newly formed cavity thereby rendering it oversize and incapable of rigidly securing the circuitry. These bubbles provide a site favorable for a corrosive environment, possibly even a tunnel for ingress of corrosive elements, notably moisture, from the exterior.

Other alternative methods for forming the cavity in a laminated board are:

a. mechanical milling
b. chemical milling, i.e., photoetching

Either one of these has the disadvantage of removing one or more layers of glass fabric in the laminated board, thereby structurally weakening it. The lateral walls of the cavity formed by mechanical milling are rectalinearly vertical; by chemical milling they are concavely dished, with a profile as seen in cross-section of an approximately circular arc. Neither of these profiles properly matches that of the HDTF circuitry in an intimately mated relationship. Typically, the circuitry is formed by chemical milling and hence also has a concavely dished lateral wall seen in cross-section as an approximately circular arc, which cannot properly register with the above mentioned rectalinearly vertical or concavely dished walls of the preformed cavity.

We have found that a cavity that will properly receive and intimately confine HDTF circuitry produced by photomasking a blank from a pattern master transparency followed by chemical milling in the unmasked portions is formed by a form tool which likewise is produced by photomasking a metal plate from the same pattern master transparency followed by chemical milling in the unmasked portions to a depth equal to the thickness of the circuitry. This process, hereinafter referred to as photoetching, faithfully reproduces the characteristic profile of chemical milling, as well as the unique design of the master pattern and its dimensions.

One of the objects of the invention is to thermoform a cavity in a resin-imbedded woven glass fabric laminated board, faithfully repreducing the pattern shape, depth, profile and dimensions of HDTF circuitry, i.e., including convex lateral walls complementary to the concave profile of the lateral walls of the circuitry.

Another object of the invention is to thermoform a cavity in a laminated board free of air bubbles adjacent to the cavity.

A third object of the invention is to thermoform a cavity with a compression ratio of from about 35% to about 77% in a laminated board without destroying the integrity of one or more fabric layers.

A fourth object of the invention is to preform a cavity in a laminated board with minimum XY (lateral) flow of the imbedding resin.

A fifth object of the invention is to vertically depress and compress, and to horizontally stretch the glass fabric so as to cradle the cavity in the nested plurality of woven glass fabrics in the laminated board.

A sixth object of the invention is to provide a laminated board with a cavity therein cradled in the nested plurality of woven glass fabrics which remain under residual tension at ambient temperature, thereby maintaining compressive forces on the resin in which they are imbedded.

A seventh object of the invention is to provide a void-free laminated package of thick film circuitry.

DETAILED DESCRIPTION

Figure 1:
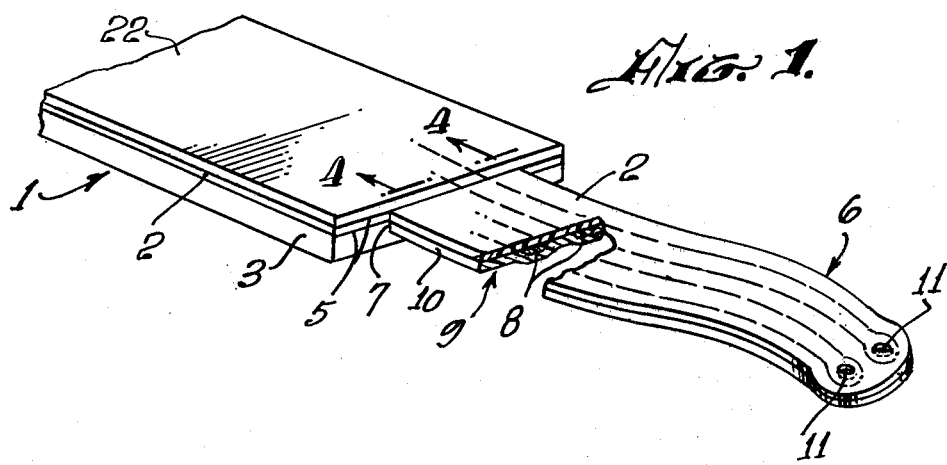
FIG. 1 is a fragmentary perspective view partly in section showing a simple laminated package illustrating the basic elements of the invention.

Referring now to FIG. 1 the void-free laminated circuit package unit, generally shown as 1, is seen in perspective with a flexible lead, with a portion broken away at 9 to show internal structure and generally indicated as 6, emerging at 7 from one end of the package unit. A circuit supporting resin layer 2 comprises the intermediate layer of the package unit 1 from whence it continues uninterruptedly as a narrow circuit supporting extension thereof to comprise the upper layer of the flexible lead 6. The supporting resin layer 2 is bonded on its upper face to a single cover layer 22 of resin-imbedded woven glass fabric and on its lower face to a laminated board 3 by means of a separate bonding resin layer 5 on each side within the body of the package unit 1 and to a thermosetting resin layer comprising the lower encapsulating layer 10 of the flexible lead 6. Bonded to the circuitry supporting layer 2 both within the body of the package unit and in the flexible lead as well is the circuitry itself, represented by two conductors 8, exposed in the broken away portion of the lead 6. Two terminal perforations 11 in the end of the flexible lead provide contact points for electrical access to the circuitry. Although a single unit package is shown, a package may consist of a multiple number of such units minus their cover layers 22, same or different, stacked and bonded to each other with a cover layer 22 on the topmost unit only to comprise a single package.

Figure 2:
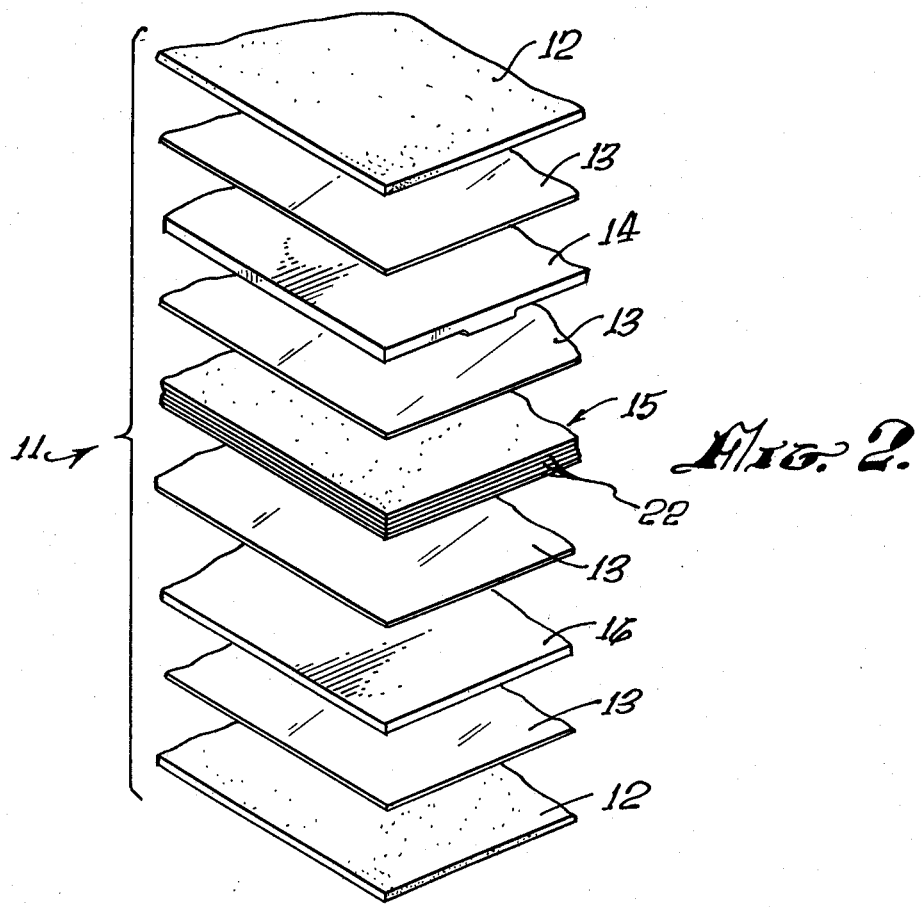
FIG. 2 is an exploded schematic view in perspective illustrating the assembled components of the composite stack for forming the laminated board with a cavity precisely to pattern, profile and dimension.

In FIG. 2 an exploded perspective view of an assembled stack generally indicated as 11 taken in sequence commencing from the top is schematically shown to consist of:

a pressure pad 12
a release sheet 13
a metal form tool 14, tool face down
a release sheet 13
a precursor 15 of the laminated board 3, consisting of a plurality of sheets of prepreg 22
a release sheet 13
a metal face plate 16
a release sheet 13
a pressure pad 12

This stacked composite, assembled as shown above, is ready for placing between the heated platens of the press. We have found no difference, whether the stack is placed erect as shown, or inverted.

Two pressure pads 12 are shown, one each at the top and bottom ends, respectively, of the stack. They consist of Kraft paper or chipboard ranging in thickness of from about 0.006 inch to about 0.050 inch and they serve to yieldably equalize the pressure in the press.

Four release sheets 13 are shown in alternate layers, where they function as a parting composition to prevent adhesion of adjacent surfaces. Perfluorinated polymers are well known for their ability to prevent adhesion. Specifically, a polyvinyl fluoride film, known by the commercial name of TEDLAR,* a registered trade mark of the E. I. du Pont Co. is eminently suitable, in thin film, i.e., about 0.001 inch thickness.

The metal form tool shown as 14 is a one piece construction formed from a metal plate ranging in thickness from about 0.063 inch to about 0.075 inch. The metal of which it is composed may be one selected from the group consisting of stainless steel, copper, copper alloys, aluminum, aluminum alloys, nickel, and titanium, but stainless steel is preferred for its superior mechanical properties and corrosion resistance. The form tool, like the circuitry which is to be packaged, are both produced by the well known photoetching process.

In this process the same pattern master positive or negative transparency that is used to photomask the photoetched circuitry is used to photomask the metal plate surface selectively in those portions where no etching is desired, provided that the photomask in both cases is of the same kind, i.e., positive or negative, resp.. For the purposes of this disclosure it is understood that this qualification as to kind of pattern master transparency and kind of photomask used in combination therewith is incorporated within the scope of the term "same pattern master transparency" as used herein. The photomasked plate is then exposed to an etchant bath where the unmasked portions of the surface are chemically attacked and dissolved away to a depth equal to the initial thickness of the metal foil in the clad laminate from which the circuitry was made. This photoetching step is well developed and understood in the closely related arts of photoengraving and chemical milling. Consequently it need not be described in detail here. A cavity having walls composed of the photomask per se, however without etching as in photoetching, is taught by C. W. Weller in U.S. Pat. No. 3,457,639 issued on July 29, 1969 which may be consulted for its teaching of the step of photomasking. Since chemical milling in combination with photomasking as taught herein is synonymous with photoetching, we employ these terms interchangeably. For the purposes of this disclosure they are understood to mean the same thing.

Figure 3:
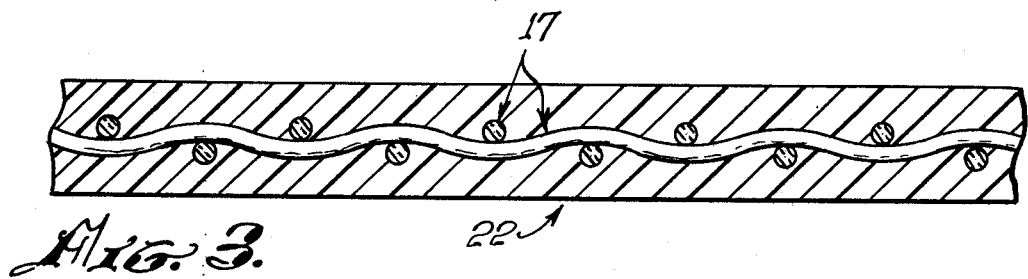
FIG. 3 is a fragmentary enlarged cross sectional view of a single sheet of resin-imbedded woven glass fabric, i.e., prepreg.

As shown in FIG. 3 the threads 17 of the woven glass fabric in the prepreg are imbedded in the resin approximately at midthickness of the sheet of prepreg generally shown as 22.

Figure 4:
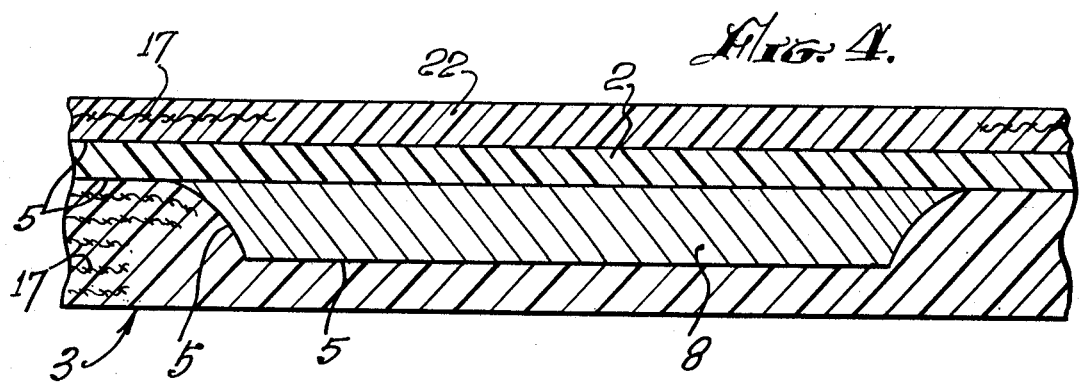
FIG. 4 is an enlarged fragmentary cross-sectional view taken along line 4—4 of FIG. 1 through a single sheet of resin-imbedded woven glass fabric, the supporting resin sheet, the laminated board, a single conductor of the packaged circuit, and through films of bonding resin residing in the joints therebetween.

A single conductor 8 is shown in FIG. 4 as seen in cross-section through a packaged unit of this invention. The conductor 8 is bonded to supporting resin layer 2 in a combination that survives after photoetching the circuitry from an original blank of metal-clad supporting resin layer. The laminated board 3 is shown with 5 layers of imbedded woven glass fabric. The preformed cavity therein is seen to follow the concavely dished profile of the lateral walls of the conductor and every dimension thereof so closely that what remains of the bonding resin layer 5 is in the interface of the joint is merely a very thin film. The fit is so close and intimate that no room remains for voids or air bubbles adjacent to the preformed cavity that the bonding resin layer 5 cannot fill completely, while plastic and under pressure in the hot press.

Figure 5:
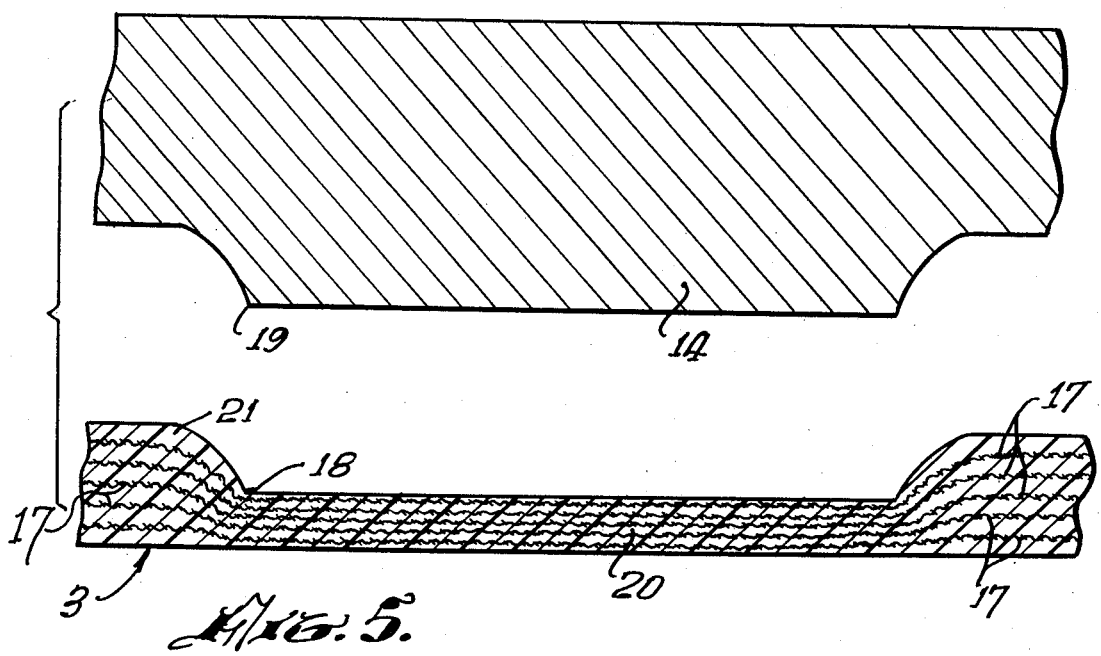
FIG. 5 is an enlarged view in section showing the manner in which the laminated board is formed.

The manner in which the cavity is formed in the laminated board and the effect this has on the internal structure of the board is shown in FIG. 5. The form tool 14, with sharp edge 19 is seen being withdrawn from the preformed cavity with a corresponding sharp edge 18. A zone 20 of high compression is shown in the bottom of the cavity and a zone 21 of low pressure is shown adjacent to a lateral wall of the cavity. In zone 20 the layers 17 of woven glass fabric are seen to be tightly compacted with little space remaining for the imbedding resin. The situation in zone 21 is the reverse; a surplus amount of resin is needed to backfill above the topmost fabric layer. It is seen that air bubbles and voids are most likely to occur in zone 21.

A unique characteristic of the chemical milling process is that it undercuts the masked edge in the direction parallel to the surface at about the same rate that it penetrates into the body of the plate in the direction normal to the surface. As a result the cavity is bounded by walls which are concavely dished, with a profile seen in cross-section approximately as a circular arc. The photoetched circuit and the photoetched form tool will both have this same characteristic profile in addition to being precisely identical as to pattern shape and dimension. A secondary characteristic of photoetched cavities and circuitry is that internal corners are rounded in plan view, whereas external corners faithfully reproduce the original angle in its original sharpness.

The precursor 15 of the laminated board 3 consists of a plurality of sheets of prepreg 22. The plurality may be any number of from about 3 to about 10, typically about 5. It equals the quotient, rounded off upwardly, obtained by dividing the final average overall thickness desired of the laminated board 3 by the nominal pressed thickness of a single sheet of the prepreg. For example, to produce a laminated board 0.015 inch thick, 5 sheets of prepreg complying with Military Specification MIL-G-55636, Grade D, having a prepreg average thickness of about 0.004 inch, a nominal pressed thickness of about 0.0035 inch, a woven glass thickness of about 0.002 inch, and a resin content of from about 61% to about 69%, adequately provided the desired 0.015 inch average pressed thickness. Computation: 0.015 divided by 0.0035 = 4.3, which rounds off upwardly to 5 sheets.

Suitable prepregs are commercially available under trade names such as CORLAR* and TECHNIFLY,** representing the epoxy type, and PYRALIN* II, representing the polyimide type.

* TEDLAR, CORLAR and PYRALIN are registered trade marks of E. I. du Pont de Nemours & Co., Wilmington, Del. ** TECHNIPLY is a registered trade mark of Howe Industries, Panorama City, Calif.

The metal face plate 16, like the form tool 14, with a thickness typically of from about 0.063 inch to about 0.075 inch is composed of a metal selected from the group consisting of stainless steel, copper, copper alloys, aluminum, aluminum alloys, nickel and titanium. Stainless steel is preferred for its superior mechanical properties and corrosion resistance. The thickness is not critical. It is simply a matter of good compromise between considerations of weight (portability), rigidity, heat conductivity, heat capacity, and cost of metal, electrical consumption, cooling water, and time in the press.

Two parallel series of tests were run to explore the possibility of eliminating the air bubbles and voids and other already mentioned problems associated with application of the manufacturer's press and post cure cycles to the laminated packaging of HDTF circuitry. In one series of tests an epoxy-resin-based prepreg, designated as CORLAR* 5150 was used in the precursor of the laminated board. In the second series a polyimide-resin-based prepreg designated as PYRALIN*II was used. The manufacturer's press and post cure cycles are tabulated below in Table I.

Table I

| Manufacturer's Specifications for Press Cycle for Prepregs Containing B-Stage Thermosetting Resins | | |
|---|---|---|
| Prepreg Name | CORLAR*5150 | PYRALIN*II |
| Resin Type | epoxy | addition type polyimide |
| Initial press cycle: | | |
| Temp. | 340° F. | 250° F. |
| Pressure | 20 psi | 200–500 psi |
| Dwell time | 3 mins. | 15 mins. |
| Final press cycle: | | |
| Temp. | 340° F. | 350° F. |
| Pressure | 250 psi | 200–500 psi |
| Dwell time | 20 mins. | 2 hrs. |
| Post cure for complete cure: | | |
| Temp. | 340–350° F. | 425° F. |
| Pressure | 75–250 psi | |
| Dwell time | 37 mins. | 0.5 hr*confined by tooling 3.5 hr*under restraint |

***in a circulating air oven

It was learned from past experience that the problem with air bubbles and voids appears as early as in the initial low pressure portion of the cycle. Consequently, the tests explored the influence of variations in dwell time and pressure in this step only. For the remainder of the cycle, the manufacturer's specification was followed, except that the post cure was interrupted one hour short of complete cure in order to separate the form tool from the preformed cavity in the laminated board and to assemble the circuitry therein and complete the packaging thereof simultaneously with the completion of cure in the press. For the purpose of these tests the cover layer 22 of the prepreg as well as the sheet of bonding resin 5 interposed between it and the supporting resin layer 2, as is depicted in FIG. 1 for the complete package, were omitted. This was done for the sake of clearer visibility for inspection for voids and air bubbles in the joint between the cavity wall and the circuitry, as seen through the supporting resin layer 2, which is relatively transparent.

Eight experimental tests were performed first in the epoxy resin series and again in the polyimide resin series, as outlined below in Table II.

circuitry 8, is placed over the combination precisely in registry with the cavity. The stack is placed between the heated platens of the press and subjected to the conditions specified for the final cure with bonding step. Upon completion of the cure with bonding the platens are rapidly cooled to ambient temperature of about 80° F. and the complete laminated circuit package is removed from the press and inspected for defects. The test results are tabulated in Table II.

In test A the conditions were those specified by the

Table II

| Test | Dwell Cycle Experimental Tests | | | | | | | |
|---|---|---|---|---|---|---|---|---|
| | A | B | C | D | E | F | G | H |
| Low pressure: | | | | | | | | |
| Temp. (° F.) | 340 | 340 | 340 | 340 | 340 | 340 | 340 | 340 |
| Pressure (psi) | 20 | 10 | 10 | 12 | 11 | 5 | 8 | 9 |
| Dwell (mins.) | 3 | 3 | 3.5 | 3.5 | 3.5 | 3.5 | 3.5 | 3.5 |
| High pressure: | | | | | | | | |
| Temp. (° F.) | 340 | 340 | 340 | 340 | 340 | 340 | 340 | 340 |
| Pressure (psi) | 250 | 250 | 250 | 250 | 250 | 250 | 250 | 250 |
| Time (mins.) | 20 | 20 | 20 | 20 | 20 | 20 | 20 | 20 |
| Test Results: | | | | | | | | |
| Epoxy series: | | | | | | | | |
| Cavities or bubbles | sev. large | few small | none | small | none | none | none | none |
| Lamination | good | good | good | good | good | bad | fair | good |
| Polyimide series: | | | | | | | | |
| Cavities or bubbles | sev. large | few small | none | small | none | med. | small | none |
| Lamination | good | good | good | good | good | good | good | good |

In these tests the precursor of the laminated board consisted of a plurality of 5 layers of prepreg, each layer having an average thickness of 0.004 inch, a nominal pressed thickness of 0.0035 inch, a woven glass fabric thickness of 0.002 inch, and a resin content of 61%. The overall average thickness of the laminated board produced therefrom was 0.015 inch. The average depth of the cavity thermoformed therein was 0.010 inch. Consequently the compression ratio in the cavity area was $0.010 \div 0.015 \times 100 = 67\%$. The same form tool was used throughout the tests and the foregoing parameters were held constant.

The various components were assembled and stacked as depicted in FIG. 2 and the stacked composite was placed between the platens of a press preheated to 340° F.. The manufacturer's recommended temperature of 340° F. for the epoxy prepreg was adopted unchanged for the entire cycle in the epoxy series, and for the initial low pressure portion only in the polyimide series where it appeared to serve our purpose just as well. However, the manufacturer's higher temperature recommendations for subsequent portions of the cycle for polyimide were diligently followed, except that the post cure and the final cure with bonding steps were carried out under pressure in the heated press instead of in a circulating air oven as specified.

It should be pointed out that the stack includes as one component the form tool 14 which replaces the prior art supporting resin layer 2 with the circuitry 8 bonded thereto, up to the point in the cycle where the cure is interrupted. The prior art process did not require disassembly of the stack to remove the form tool and reassembly of another composite stack to contain the circuitry, consequently it did not require interruption of the curing cycle to perform these tasks.

At the point of interruption of the cycle the platens of the press are rapidly cooled to ambient temperature of about 80° F., the pressure is released and the laminated board with preformed cavity therein is removed. The laminated board 3 is assembled with cavity side up, a sheet of bonding resin 5 is placed over it, and the supporting resin layer 2, having bonded to its lower side the manufacturer and the result was several large cavities or bubbles in the joint. In test B the pressure was reduced by 50% and the results were a few small bubbles, a substantial improvement, but not good enough. In test C the dwell time was increased by half a minute while the pressure was held the same as in B. The results were better than B, with no cavities or bubbles. In subsequent tests the dwell time was held constant at 3.5 minutes. In test D the pressure was increased to 12 psi with the result that a small bubble appeared in the joint. In test E the pressure was dropped to 11 psi with about the same good results as at 10 psi. In test F the pressure was dropped to 5 psi with results of no cavities or bubbles, however, with a new problem: poor bonding or "lamination" of the layers of prepreg to each other. The pressure was increased to 8 psi in test G with the result that the lamination was fair, but not good enough. In test H the pressure was increased to 9 psi with the same good results as were obtained at 10 psi and 11 psi in tests C and E, respectively. This indicates that good results can be obtained at 340° F. within the range of from about 9 psi to about 11 psi with a dwell time of 3.5 minutes for prepregs based on epoxy resin, specifically for CORLAR* and TECHNIPLY**.

The second series of tests with a prepreg based on polyimide resin followed exactly the same pattern of variations of dwell time and pressure as in the first series. The results of tests A, B, C, D, and E were identical with the corresponding tests in the first series. In test F at a pressure of 5 psi, medium sized bubbles appeared in the joint. In test G at 8 psi the bubbles appearing in the joint were considerably smaller, which was still unsatisfactory. In test H at 9 psi no bubbles appeared in the joint.

In the second series no lamination problem occurred as distinguished from the first series. Nevertheless good void-free joints were again obtained at 340° F. at a pressure of from about 9 psi to about 11 psi, preferably about 10 psi, with a dwell time of 3.5 minutes, with prepregs based on polyimide resin.

As a result of these tests the press and cure cycles specified by the manufacturer for each of these types of prepreg were modified to have the same initial low pressure cycle as optimized in the above tests. The complete press and cure cycle for each type of prepreg, as modified according to the invention, is shown below in Table III.

Table III

| Press Cycle Modified According to the Invention | | |
| --- | --- | --- |
| Prepreg name | CORLAR*5150 | PYRALIN*II |
| Resin type | epoxy | addition type polyimide |
| Initial press cycle: | | |
| Temp. (° F.) | 340 | 340 |
| Pressure (psi) | 9–11, pref. 10 | 9–11, pref. 10 |
| Dwell time (secs.) | 195–225, pref. 210 | 195–225, pref. 210 |
| Final press cycle: | | |
| Temp. (° F.) | 320–360, pref. 340 | 330–370, pref. 350 |
| Pressure (psi) | 225–275, pref. 250 | 200–500, pref. 250 |
| Dwell time (mins.) | 20 | 120 |
| Post Cure: | None | |
| Temp. (° F.) | — | 420–430, pref. 425 |
| Pressure (psi) | — | 200–500, pref. 250 |
| Dwell time (mins.) | — | 180***confined by tooling |
| Rapidly cool to ambient temperature, about 80° F. | | |
| Remove laminated board with preformed cavity therein | | |
| Assemble components of laminated circuit package | | |
| Final cure with bonding: | | |
| Temp. (° F.) | 320–360, pref. 340 | 420–430, pref. 425 |
| Pressure (psi) | 75–250, pref. 250 | 200–500, pref. 250 |
| Dwell time (mins.) | 45–60, pref. 60 | 45–60, pref. 60 |
| Rapidly cool to ambient temperature, | | |
| Release from pressure and restraint, and | | |
| Recover completely cured and bonded void-free | | |
| package of laminated circuitry | | |

***in a circulating air oven

It is believed that the occurrence of air bubbles or voids in the laminated circuit package unit is eliminated by a combination of the improvements of this invention rather than by any one of them alone. Specifically, the three improvement elements listed below are mutually cooperative and are essential for the successful operation of the process:

a. the preformed cavity
b. the photoetched form tool, and
c. the modified low pressure cycle This directs the attention exclusively to the initial step in the press, namely to the low pressure cycle, which is most critical in the forming of the cavity. Excepting the interrupted post cure all subsequent processing follows without modification the specifications of the manufacturer of the specific prepreg. The following mechanism of the process appears to be consistent with the observed facts. At the higher initial press cycle pressure specified by the manufacturer of the prepreg the form tool sinks into the heat softening precursor too fast and too soon. The resin is to viscous and cannot flow fast enough from the compressed zone seen in FIG. 5 as 20, around the corner 18 of the cavity and corresponding 19 of the form tool to backfill the low pressure zone 21. The plurality of resin-imbedded woven glass fabrics designated as 17 are shown in FIG. 5 to be depressed into a nested configuration under a state of vertical compression and horizontal tension. Some of the resin escaping from zone 20 must filter vertically through one or more layers of the fabric in order to reach zone 21. Failing to do so, it flows instead horizontally, so-called XY flow, between the layers of fabric, escaping to the perimeter of the laminated board as waste, leaving air bubbles or voids in zone 21.

We have found that by reducing the pressure to 10 ± 1 psi and increasing the dwell period to 210 ± 15 seconds the resin can flow from zone 20 to properly backfill in zone 21, and the problem of air bubbles or voids adjacent to the cavity is eliminated, provided the form tool itself conforms precisely in pattern shape, dimension, depth and profile to that of the circuitry.

Since the unique profile characteristic of photoetched circuitry can be faithfully reproduced only by photoetching the form tool, thereby faithfully reproducing the pattern shape and dimensions as well, a bonus feature is derived from the one-piece construction of the form tool. The pattern of circuitry on the form tool will not swim and shift out of position or registry in the molten resin while under pressure in the press. This does occur when the supporting resin layer-backed circuitry is pressed into the precursor in the method of the prior art. Furthermore, the massive one-piece construction of the metal plate offers the advantage of large heat capacity and good heat conductivity, whereby the resin of the prepreg softens faster in contact with the form tool in the heated press and, conversely, cools faster in the cooling cycle.

The forming tool and the circuitry both having been produced by photoetching of the metal from the same pattern master transparency, it follows that the cavity produced in the laminated board by the forming tool will conform in minutest detail to every contour of the circuit, and that it will confine the circuit securely in the final laminated circuit package.

The laminated circuit package is made by assembling in sequence the following components of a composite stack:

i. a metal face plate 16
ii. a pressure pad 12
iii. a release sheet 13
iv. a sheet of partly cured prepreg 22
v. a bonding resin layer 5
vi. the supporting resin-backed circuitry layer 2, with circuitry 8 side facing down
vii. a bonding resin layer 5
viii. the laminated board 3 with cavity side facing up and precisely in registry with the circuitry of vi.
ix. a release sheet 13
x. a pressure pad 12
xi. a metal face plate 16

The above listed components are the same as already described for the composite stack 11 assembled for thermoforming the laminated board, excepting the two sheets of bonding resin layer 5. These are sheets of about 0.002 inch thickness of a thermoplastic resin capable of adhesively bonding the components of the laminated circuit package together, such as an acrylic resin or a B-stage unsupported epoxy resin. The sequence in the stack is slightly different than before in 11, and there are two metal face plates instead of one.

The above assembled stack is placed, erect or inverted, between the platens of a press preheated, in the case of CORLAR*5150 or TECHNIPLY** to from 320°–360° F., preferably about 340° F. at a pressure of from about 75 to 250 psi, preferably 250 psi for from 45 to 60 minutes, preferably about 60 minutes, and in the case of PYRALIN*II preheated to from 420°–430° F., preferably about 425° F., at a pressure of from 200–500 psi, preferably about 250 psi, for from 45–60 minutes, preferably about 60 minutes, which completes the cure of the resin in the laminated board and bonding of the components, cooling the platens to ambient temperature of about 80° F., and removing the completed laminated circuitry package. A laminated circuitry package may comprise one or more package units, same or different, stacked one upon the other excepting that the cover sheet 22 of prepreg is omitted from each such package unit other than the topmost unit in the stack, and the stack is cured in the press under pressure as above, all units at the same time. Laminated circuit packages consisting of as many as 10 package units are rather common.

The preferred and alternative embodiments of the invention have in common the following elements:

i. a circuit formed by photoetching after photomasking with a pattern master transparency, a blank of metal foil adhesively bonded on a supporting resin layer, ii. a one-piece form tool formed by the photoetching of a face of a metal plate after photomasking with the same pattern master transparency that was used to photoetch the curcuit, iii. a modified low pressure dwell cycle in the press consisting of about 10 ± 1 psi, preferably about 10 psi, at about 340° F. for about 210 ± 15 seconds, preferably about 210 seconds, followed by a high pressure cycle consisting of about 250 ± 25 psi, preferably about 250 psi, at about 340° F. for about 20 minutes, and iv. preforming a cavity in the precursor of the laminated board to receive said photoetched circuit in an intimately mated relationship with respect to the precise pattern shape, dimension, depth and profile by the process of employing said form tool and the said modified low pressure dwell cycle followed by a high pressure cycle unmodified, as specified by the manufacturer of the prepreg that is used in said precursor for the specific resin in his product, except to interrupt the post cure one hour short of complete cure to provide a laminated board, the resin content of which being still in an incomplete stage of cure, is provided ready to receive said circuit to complete a void-free laminated package unit.

We claim:

1. In the conventional process for producing a laminated package of HDTF circuitry adhesively bonded to a supporting resin layer, where said circuitry is derived by photoetching a metal blank adhesively bonded to said supporting resin layer in accordance with a pattern master transparency, the imprunement consisting of:

a. preforming a cavity in a precursor of a laminated board precisely to fit the pattern shape, depth, profile and dimensions of the circuitry, by b. thermoforming with a metal form tool derived by photoetching a metal plate in accordance with the same said pattern master transparency to a depth equal to the thickness of said circuitry, c. impressing said form tool into said precursor in a press with platens heated to about 340° F. in a modified low pressure dwell cycle consisting of a pressure of from about 9 psi to about 11 psi of net plan view area for a dwell time of from about 195 seconds to about 225 seconds, followed by incompletely curing said precursor in a high pressure cycle unmodified, as specified by the manufacturer of the prepreg that is used in said precursor for the specific resin in his product, but interrupted short of completion of cure, and recovering a laminated board with a preformed cavity therein.

2. The process according to claim 1 wherein said metal in said metal form tool is a metal selected from the group consisting of stainless steel, copper, copper alloys, aluminum, aluminum alloys, titanium and nickel.

3. The process according to claim 1 wherein said metal in said metal form tool is stainless steel.

4. The process according to claim 1 wherein the resin in said precursor of a laminated board is a thermosetting resin in the B stage of polymerization, selected from the group consisting of epoxy and polyimide.

5. The process according to claim 4 wherein said form tool is photoetched from a plate of stainless steel of from about 0.063 inch to about 0.075 inch initial thickness to a depth of from about 0.004 inch to about 0.025 inch.

6. The process according to claim 4 wherein said precursor of a laminated board consists of a plurality of from about 3 to about 10 sheets of prepreg.

7. The process according to claim 6 wherein said plurality is about 5 sheets of prepreg.

8. The process according to claim 6 wherein each individual sheet of said prepreg has an initial thickness of about 0.004 inch.

9. The process according to claim 8 wherein said individual sheet of prepreg has a compressed average thickness of about 0.003 inch excepting in the area of the cavity.

10. The process according to claim 6 wherein the compression ratio in the bottom of the cavity is from about 35% to about 77%.

11. A process for producing a void-free laminated package of HDTF circuitry consisting of stacking a composite commencing at the bottom in sequence as follows:

a. said laminated board with said cavity preformed therein according to the process of claim 10, with cavity side up, b. a first sheet of bonding resin, c. said HDTF circuitry adhesively bonded to a supporting resin layer according to claim 10, oriented with circuit side down and precisely in registry with said preformed cavity, d. a second sheet of bonding resin, e. a single sheet of prepreg, as a cover layer, placing the stacked composite between the platens of a press preheated to a temperature of from about 320° F. to about 425° F. under a pressure of from about 75 psi to about 500 psi for a dwell period of from about 45 minutes to about 60 minutes, cooling the platens to ambient temperature of about 80° F. and removing the void-free laminated package of HDTF circuitry from the press with the resin content of said laminated board in a completely cured state.

12. The process according to claim 11 wherein said first and second sheets of bonding resin have an initial thickness of about 0.002 inch.

13. The process according to claim 12 wherein the resin in said laminated board and in said cover layer prepreg is an epoxy resin and the platens are preheated to 340° F. for the final cure with bonding step.

14. The process according to claim 13 wherein the pressure in the press is about 250 psi.

15. The process according to claim 12 wherein the resin in said laminated board and in said cover layer prepreg is a polyimide resin, wherein said stacked composite is confined under pressure of from about 200–500 psi at about 425° F. for the final cure with bonding step.

16. The process according to claim 15 wherein the final cure with bonding step is conducted under a pressure of about 250 psi.

17. In a laminated board adapted to receive HDTF circuitry adhesively bonded to a supporting layer, where said circuitry is derived by photoetching a metal blank adhesively bonded to said supporting resin layer in accordance with a pattern master transparency, said laminated board being produced from a precursor of the laminated board consisting of a plurality of from about 3 to about 10 sheets of prepreg, the resin of said prepreg being in the B stage of polymerization and selected from the group consisting of epoxy and polyimide, where said laminated board is produced by the process of:
   a. preforming a cavity in the precursor of said laminated board precisely to fit the pattern shape, depth, profile and dimensions of the circuitry, by
   b. thermoforming with a metal tool derived by photoetching a metal plate in accordance with the same said pattern master transparency to a depth equal to the thickness of said circuitry,
   c. impressing said form tool into said precursor in a press with platens heated to about 340° F. in a modified low pressure dwell cycle consisting of a pressure of from about 9 psi to about 11 psi of net plan view area for a dwell time of from about 195 seconds to about 225 seconds, followed by incompletely curing said precursor in a high pressure cycle unmodified, as specified by the manufacturer of the prepreg that is used in said precursor for the specific resin in his product, but interrupted short of completion of cure, and recovering a laminated board with a preformed cavity therein, the structural improvement wherein the imbedded woven glass fabric in the midthickness of each sheet of said plurality of sheets of prepreg cradles said cavity in a nested plurality of equally spaced layers of said woven glass fabric, and said woven glass fabric is retained in a horizontally stretched and vertically compressed condition.

18. A laminated board with a cavity produced according to claim 17, wherein said stretched woven glass fabric is under residual tension at ambient temperature thereby maintaining internal compressive forces on the resin in which it is imbedded.

19. In a laminated package of HDTF circuitry adhesively bonded to a supporting layer, where said circuitry is derived by photoetching a metal blank adhesively bonded to said supporting resin layer in accordance with a pattern master transparency, a laminated board with a preformed cavity therein intimately enclosing said circuitry, produced from a precursor of said laminated board consisting of a plurality of from about 3 to about 10 sheets of prepreg, the resin of said prepreg being epoxy resin in the B stage of polymerization, where said laminated package is produced by the process of:
   a. preforming the cavity in the precursor of said laminated board precisely to fit the pattern shape, depth, profile and dimensions of the circuitry, by
   b. thermoforming with a metal tool derived by photoetching a metal plate in accordance with the same said pattern master transparency to a depth equal to the thickness of said circuitry,
   c. impressing said form tool into said precursor in a press with platens heated to about 340° F. in a modified low pressure dwell cycle consisting of a pressure of from about 9 psi to about 11 psi of net plan view area for a dwell time of from about 195 seconds to about 225 seconds,
   d. incompletely curing said precursor at about 340° F. and about 250 psi for about 20 minutes,
   e. recovering a laminated board with a preformed cavity therein, wherein the woven glass fabric in the midthickness of each sheet of said plurality of sheets of prepreg cradles said cavity in a nested plurality of layers of said woven glass fabric,
   f. stacking a composite commencing at the bottom in sequence as follows:
      i said laminated board with said cavity preformed therein with cavity side up,
      ii a first sheet of bonding resin,
      iii said HDTF circuitry adhesively bonded to said supporting resin layer, oriented with circuit side down and precisely in registry with said preformed cavity,
      iv a second sheet of bonding resin,
      v a single sheet of prepreg, as a cover layer,
   g. placing the stacked composite between the platens of a press preheated to a temperature of about 340° F. under a pressure of about 250 psi for a dwell period of about 60 minutes, cooling the platens to ambient temperature of about 80° F., and removing the laminated package of HDTF circuitry with the resin content of said laminated board in a cured state, the improved structure wherein said nested plurality of layers of woven glass fabric are equally spaced in the bottom and sides of said preformed cavity.

20. In a laminated package of HDTF circuitry adhesively bonded to a supporting layer, where said circuitry is derived by photoetching a metal blank adhesively bonded to said supporting resin layer in accordance with a pattern master transparency, a laminated board with a preformed cavity therein intimately enclosing said circuitry, produced from a precursor of said laminated board consisting of a plurality of from about 3 to about 10 sheets of prepreg, the resin of said prepreg being polyimide resin in the B stage of polymerization, where said laminated package is produced by the process of:
   a. preforming the cavity in the precursor of said laminated board precisely to fit the pattern shape, depth, profile and dimensions of the circuitry, by
   b. thermoforming with a metal tool derived by photoetching a metal plate in accordance with the same said pattern master transparency to a depth equal to the thickness of said circuitry,
c. impressing said form tool into said precursor in a press with platens heated to about 340° F. in a modified low pressure dwell cycle consisting of a pressure of from about 9 psi to about 11 psi of net plan view area for a dwell time of from about 195 seconds to about 225 seconds,
d. incompletely curing said precursor at about 350° F. and about 250 psi for about 120 minutes, then at about 425° F. and about 250 psi for about 180 minutes,
e. recovering a laminated board with a preformed cavity therein, wherein the woven glass fabric in the midthickness of each sheet of said plurality of sheets of prepreg cradles said cavity in a nested plurality of layers of said woven glass fabric,
f. stacking a composite commencing at the bottom in sequence as follows:
  i said laminated board with said cavity preformed therein with cavity side up,
  ii a first sheet of bonding resin,
  iii said HDTF circuitry adhesively bonded to said supporting resin layer, oriented with circuit side down and precisely in registry with said preformed cavity,
  iv a second sheet of bonding resin,
  v a single sheet of prepreg, as a cover layer,
g. placing the stacked composite between the platens of a press preheated to a temperature of about 425° F. under a pressure of about 250 psi for a dwell period of about 60 minutes, cooling the platens to ambient temperature of about 80° F., and removing the laminated package of HDTF circuitry with the resin content of said laminated board in a cured state, the improved structure wherein said nested plurality of layers of woven glass fabric are equally spaced in the bottom and sides of said preformed cavity.

* * * * *